US012196887B1

(12) United States Patent
Jiang et al.

(10) Patent No.: US 12,196,887 B1
(45) Date of Patent: Jan. 14, 2025

(54) SILICON PHOTONIC CHIP, LiDAR, AND MOBILE DEVICE

(71) Applicant: SUTENG INNOVATION TECHNOLOGY CO., LTD., Shenzhen (CN)

(72) Inventors: Peng Jiang, Shenzhen (CN); Penghui Dong, Shenzhen (CN); Hao Wang, Shenzhen (CN)

(73) Assignee: SUTENG INNOVATION TECHNOLOGY CO., LTD., Shenzhen (CN)

( * ) Notice: Subject to any disclaimer, the term of this patent is extended or adjusted under 35 U.S.C. 154(b) by 0 days.

(21) Appl. No.: 18/764,122

(22) Filed: Jul. 3, 2024

(30) Foreign Application Priority Data

Aug. 14, 2023 (CN) .......................... 202311014600.9

(51) Int. Cl.
*G06F 30/30* (2020.01)
*G01S 7/481* (2006.01)
(Continued)

(52) U.S. Cl.
CPC ........ *G01S 7/4813* (2013.01); *G02B 6/12004* (2013.01); *H01L 21/82* (2013.01);
(Continued)

(58) Field of Classification Search
CPC .............. G01S 7/4813; G02B 6/12004; G02B 2006/12116; H01L 21/82; H01L 27/0203; H01P 3/00
See application file for complete search history.

(56) References Cited

U.S. PATENT DOCUMENTS 10,564,263 B2 * 2/2020 Efimov .................. G01S 17/42
10,754,010 B2 * 8/2020 Hinderling .............. G01S 17/42
(Continued)

FOREIGN PATENT DOCUMENTS

| CN | 112639529 A | 4/2021 |
|----|-------------|--------|
| CN | 115542345 A | 12/2022 |
| CN | 116087914 A | 5/2023 |

OTHER PUBLICATIONS

First Office Action issued in related Chinese Application No. 202311014600.9, mailed Sep. 20, 2023, 48 pages.
(Continued)

*Primary Examiner* — Jack Chiang
*Assistant Examiner* — Brandon Bowers
(74) *Attorney, Agent, or Firm* — BAYES PLLC

(57) ABSTRACT

A silicon photonic chip, a LiDAR, and a mobile device are disclosed. The silicon photonic chip includes a cladding, a transceiving waveguide module, a first photoelectric detection module, and a first polarization rotator. An emitting waveguide of the transceiving waveguide module extends along a first direction and is configured to transmit and emit a detection light, and the first receiving waveguide of the transceiving waveguide module is arranged at intervals along a second direction from the emitting waveguide and is configured to receive and transmit an echo light. The first photoelectric detection module is configured to receive a first local oscillator light and the echo light output by the first receiving waveguide. The first polarization rotator is disposed upstream of the first photoelectric detection module.

8 Claims, 9 Drawing Sheets

(51) Int. Cl.
  *G02B 6/12* (2006.01)
  *H01L 21/82* (2006.01)
  *H01L 27/02* (2006.01)
  *H01P 3/00* (2006.01)

(52) U.S. Cl.
  CPC ............ *H01L 27/0203* (2013.01); *H01P 3/00* (2013.01); *G02B 2006/12116* (2013.01)

(56) References Cited

U.S. PATENT DOCUMENTS

| | | | |
|---|---|---|---|
| 2019/0018120 A1* | 1/2019 | Efimov | B81B 7/02 |
| 2020/0284883 A1* | 9/2020 | Ferreira | H04N 25/773 |
| 2021/0026010 A1* | 1/2021 | Kamil | G01S 7/487 |
| 2021/0072389 A1* | 3/2021 | Boloorian | G01S 17/34 |
| 2022/0229162 A1* | 7/2022 | Tsadka | G01S 7/4818 |
| 2023/0400555 A1* | 12/2023 | Lei | G01S 17/04 |

OTHER PUBLICATIONS

Second Office Action issued in related Chinese Application No. 202311014600.9, mailed Oct. 14, 2023, 51 pages.

\* cited by examiner

SILICON PHOTONIC CHIP, LiDAR, AND MOBILE DEVICE

CROSS-REFERENCE TO RELATED APPLICATION

The present application claims the benefit of priority to Chinese Patent Application No. 202311014600.9, filed on Aug. 14, 2023, which is hereby incorporated by reference in its entirety.

TECHNICAL FIELD

This application relates to the field of LiDAR technology, particularly to a silicon photonic chip, a LiDAR, and a mobile device.

TECHNICAL BACKGROUND

In the fields of smart transportation and autonomous driving, perceiving the road environment and the surrounding environment of autonomous vehicles is important. This perception is based on the road information, vehicle position information, and obstacle information obtained by sensor devices such as LiDAR. The autonomous vehicles use this information to control themselves, adjust the safe distance between vehicles, and ensure safe and reliable driving on the road.

Frequency Modulated Continuous Wave (FMCW) LiDAR can simultaneously measure distance and speed, providing safer information and applications for autonomous or assisted driving as a 4D perception sensor module. FMCW LiDAR can detect speed and distance information within one frame of detection data.

A LIDAR in the related arts includes light source modules, silicon photonic chips, scanning modules, and photoelectric detection modules. Among them, the light source module is used to generate light signals. The silicon photonic chip includes a transceiving waveguide module composed of an emitting waveguide and a receiving waveguide. The emitting waveguide surface is used to receive and emit detection light, which is a part of the above light signal, so that the detection light is scanned by the scanning module and emitted outside the LiDAR to detect the target object. The receiving waveguide is used to receive the echo light formed by the detection light signal reflected by the target object. The photoelectric detection module is used to receive local oscillator light and echo light transmitted from the receiving waveguide. The photoelectric detection module can be integrated into the silicon photonic chip mentioned above.

Due to the manufacturing issues of silicon photonic chips, the probe light cannot be fully transmitted from at the emission end of the emitting waveguide when transmitted along it. Some of detection light is reflected at the emission end, which is generally called leading light. The leading light may enter the receiving waveguide and mix with the local oscillator light, thus affecting the frequency mixing between the echo light and the local oscillator light.

SUMMARY

Embodiments of this application provides a silicon photonic chip, a LiDAR, and a mobile device to improve the leading light entering the receiving waveguide, and improve the beat frequency mixing of the echo light and the local oscillator light.

In a first aspect, embodiments of this application provide a silicon photonic chip including a cladding, a transceiving waveguide module, a first photoelectric detection module, and a first polarization rotator. The transceiving waveguide module is embedded in the cladding and includes an emitting waveguide and a first receiving waveguide. The emitting waveguide extends along a first direction and is configured to transmit and emit a detection light to detect a target object. Viewed along the thickness direction of the silicon photonic chip, the first receiving waveguide is arranged at intervals with the emitting waveguide along a second direction and is configured to receive and transmit an echo light. The echo light is formed by the detection light being reflected by the target object. The first photoelectric detection module is configured to receive a first local oscillator light and the echo light output by the first receiving waveguide. The first polarization rotator is disposed upstream of the first photoelectric detection module and is configured to perform a 90° polarization rotation on the echo light output by the first receiving waveguide.

In some embodiments, the transceiving waveguide module includes at least one second receiving waveguide. Viewed along the thickness direction, the emitting waveguide, the first receiving waveguide, and the second receiving waveguide are arranged at intervals along the second direction. The second receiving waveguide is located on a side of the first receiving waveguide away from the emitting waveguide and is configured to receive and transmit the echo light. The silicon photonic chip further includes at least one second photoelectric detection module, each second photoelectric detection module corresponding to a second receiving waveguide. Each second photoelectric detection module is configured to receive a second local oscillator light and the echo light output by the second receiving waveguide.

In some embodiments, the silicon photonic chip includes at least one second polarization rotator. Each second polarization rotator is arranged corresponding to a second photoelectric detection module. The second polarization rotator is disposed upstream of the corresponding second photoelectric detection module and is configured to perform a 90° polarization rotation on the echo light output by the corresponding second receiving waveguide.

In some embodiments, the first polarization rotator is connected to the output end of the first receiving waveguide, and each second polarization rotator is connected to the output end of the corresponding second receiving waveguide.

In some embodiments, the first photoelectric detection module includes a first optical mixer and a first balanced photoelectric detector. The first optical mixer is configured to receive the first local oscillator light and the echo light, and to perform frequency mixing to output a first beat frequency light signal and a second beat frequency light signal. The first balanced photoelectric detector is connected to the first optical mixer and is configured to perform balanced detection on the first beat frequency light signal and the second beat frequency light signal.

In a second aspect, embodiments of this application provide a LiDAR including a housing, a light source module, and a silicon photonic chip. The light source module is configured to generate a source light signal. The silicon photonic chip is accommodated in the housing. The silicon photonic chip is the silicon photonic chip as described above and is configured to transmit and emit the detection light to detect a target object. The detection light is a part of the source light signal. The silicon photonic chip is also configured to transmit the first local oscillator light and receive the echo light. The first local oscillator light is a part of the source light signal.

In a third aspect, embodiments of this application provide a LiDAR including a housing, a light source module, and a silicon photonic chip. The light source module is accommodated in the housing and is configured to generate a source light signal. The silicon photonic chip is accommodated in the housing and includes a cladding, a transceiving waveguide module, and a first photoelectric detection module. The transceiving waveguide module is embedded in the cladding and includes an emitting waveguide and a first receiving waveguide. The emitting waveguide extends along a first direction and is configured to transmit and emit a detection light to detect a target object. The detection light is a part of the source light signal. Viewed along the thickness direction of the silicon photonic chip, the first receiving waveguide is arranged at intervals with the emitting waveguide along a second direction and is configured to receive the echo light. Any two of the first direction, the second direction, and the thickness direction are perpendicular to each other. The first photoelectric detection module is configured to receive a first local oscillator light and the echo light output by the first receiving waveguide. The first local oscillator light is a part of the source light signal. The light source module and the silicon photonic chip are configured such that the polarization direction of the first local oscillator light received by the first photoelectric detection module is perpendicular to the polarization direction of the detection light.

In some embodiments, the transceiving waveguide module further includes at least one second receiving waveguide. Viewed along the thickness direction, the emitting waveguide, the first receiving waveguide, and the second receiving waveguide are arranged at intervals along the second direction. The second receiving waveguide is located on a side of the first receiving waveguide away from the emitting waveguide and is configured to receive the echo light. The silicon photonic chip further includes at least one second photoelectric detection module. Each second photoelectric detection module corresponds to a second receiving waveguide and is configured to receive a second local oscillator light and the echo light output by the second receiving waveguide. The second local oscillator light is a part of the source light signal.

In some embodiments, the silicon photonic chip includes a first polarization rotator. The first polarization rotator is disposed upstream of the first photoelectric detection module and is configured to perform a 90° polarization rotation on the first local oscillator light received by the first photoelectric detection module.

In some embodiments, the silicon photonic chip further includes a beam splitter module. The beam splitter module includes a first input end, a first output end, a second output end, and at least a third output end. The first output end is connected to the emitting waveguide, the second output end is connected to the first photoelectric detection module, and the third output end is connected to the second photoelectric detection module. The beam splitter module is configured to receive the source light signal via the first input end, output the detection light via the first output end, output the first local oscillator light via the second output end, and output the second local oscillator light via the third output end. The first polarization rotator is connected between the second output end and the first photoelectric detection module.

In some embodiments, the silicon photonic chip further includes a beam splitter module, which includes a first beam splitter and a second beam splitter. The first beam splitter includes a first input end, a first output end, and a cascaded output end. The second beam splitter includes a second input end, a second output end, and at least a third output end. The second input end is connected to the cascaded output end. The first beam splitter is configured to receive the source light signal via the first input end, output the detection light via the first output end, and output the local oscillator light via the cascaded output end. The second beam splitter is configured to receive the local oscillator light via the second input end, output the first local oscillator light via the second output end, and output the second local oscillator light via the third output end. The first polarization rotator is connected between the cascaded output end and the second input end.

In some embodiments, the silicon photonic chip includes a first polarization rotator. The first polarization rotator is connected to the emitting waveguide.

In some embodiments, the LiDAR includes a quarter wave plate. The quarter wave plate is disposed at an end of the emitting waveguide for emitting the detection light and the receiving waveguide for receiving the echo light and is configured to convert the detection light into an elliptical polarization state or a circular polarization state light signal.

In a fourth aspect, embodiments of this application provide a mobile device including a mobile substrate and the LiDAR as described above, wherein the LiDAR is mounted on the mobile substrate.

By performing a 90° polarization rotation on the echo light, the first local oscillator light will mix with the light in the echo light having the same polarization direction as the rotated echo light, or by performing a 90° polarization rotation on the first local oscillator light, the rotated first local oscillator light will mix with the light in the echo light having the same polarization direction. The polarization direction of the first local oscillator light received by the first photoelectric detection module is perpendicular to that of the detection light, effectively preventing the interference of leading light entering the first receiving waveguide with the frequency mixing of the first local oscillator light and the echo light, thereby improving the detection accuracy of the LiDAR.

BRIEF DESCRIPTION OF DRAWINGS

The following provides a brief introduction to the drawings needed for the description of the embodiments.

100. Silicon photonic chip; 110. Cladding; 120. Transceiving waveguide module; 121. Emitting waveguide; 122. First receiving waveguide; 123. Second receiving waveguide; 130. First polarization rotator; 140. Second polarization rotator; 150. First photoelectric detection module; 151. First optical mixer; 152. First balanced photoelectric detector; 160. Second photoelectric detection module; 161. Second optical mixer; 162. Second balanced photoelectric detector; 200. LiDAR; 210. Housing; 220. Light source module; 230. Beam splitter module; 2321. First beam splitter; 2322. Second beam splitter; 240. Quarter wave plate; A. First direction; B. Second direction; 300. Mobile device; and 310. Substrate.

DETAILED DESCRIPTION

To make the objectives, technical solutions, and advantages of this application clearer, the application is further described in detail below with reference to the drawings and examples.

In an example, a LiDAR includes a light source module, a silicon photonic chip, a scanning module, and a photoelectric detection module. The light source module is configured to generate a light signal. The silicon photonic chip includes a transceiving waveguide module which includes an emitting waveguide and a receiving waveguide. The emitting waveguide receives and emits detection light, which is a part of the light signal, to detect a target object by scanning it outside the LiDAR. The receiving waveguide receives the echo light formed by the target object reflecting the detection light. The photoelectric detection module receives a local oscillator light and the echo light transmitted by the receiving waveguide. The photoelectric detection module is integrated into the silicon photonic chip.

As not all of the detection light can be transmitted out from the emitting waveguide's emission end. Some detection light is reflected at this end, and this reflected portion is generally called the precursor light. Additionally, some detection light may also be reflected at the end face of the cladding to form the precursor light. The precursor light may enter the receiving waveguide and beat with the local oscillator light, thereby affecting the beating of the echo light and the local oscillator light. In an embodiment, the precursor light entering the receiving waveguide may beat with the local oscillator light to produce a beat frequency light signal corresponding to a near distance, which does not correspond to any target object and interferes with the detection of the true beat frequency signal during detection. The precursor light also consumes part of the local oscillator light, reducing the energy of the local oscillator light available for beating with the echo light.

Embodiments of this application provide a silicon photonic chip, a LiDAR, and a mobile device to improve the issue where precursor light enters the receiving waveguide and affects the beating of echo light and local oscillator light.

Figure 1:
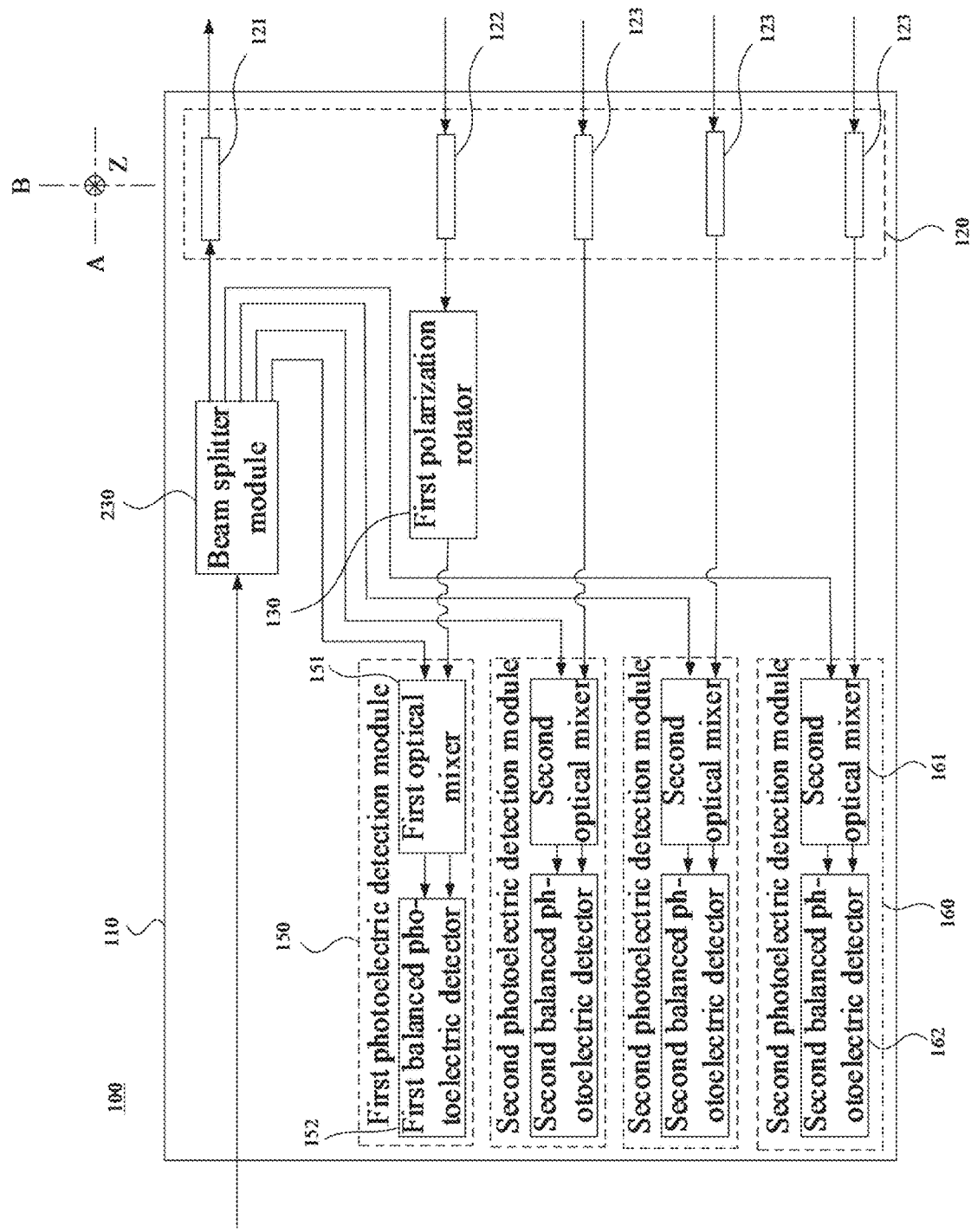
FIG. 1 is a schematic structural diagram of a silicon photonic chip with the first polarization rotator connected to the first receiving waveguide according to an embodiment.

FIG. 1 is a schematic structural diagram of a silicon photonic chip with the first polarization rotator connected to the first receiving waveguide according to an embodiment.

In a first aspect, embodiment of this application provides a silicon photonic chip, as shown in FIG. 1. The silicon photonic chip 100 is used in the LiDAR 200 to achieve the emission of detection light and the reception of echo light. The silicon photonic chip 100 includes a cladding 110, a transceiving waveguide module 120, a first photoelectric detection module 150, and a first polarization rotator 130. The cladding 110 is one of the main structures constituting the silicon photonic chip 100 and is also the substrate for the remaining structures. The transceiving waveguide module 120 is embedded in the cladding 110 and includes an emitting waveguide 121 and a first receiving waveguide 122. The emitting waveguide 121 extends along the illustrated first direction A, and is configured to transmit and emit detection light to detect a target object. Viewed along the thickness direction of the silicon photonic chip 100, the first receiving waveguide 122 is arranged at intervals with the emitting waveguide 121 along the illustrated second direction B. The first receiving waveguide 122 is configured to receive and transmit echo light. The first photoelectric detection module 150 is configured to receive a first local oscillator light and the echo light output by the first receiving waveguide 122. The first polarization rotator 130 is disposed upstream of the first photoelectric detection module 150 and is configured to perform a 90° polarization rotation on the echo light output by the first receiving waveguide 122. Any two of the first direction A, the second direction B, and the thickness direction Z of the silicon photonic chip are perpendicular to each other.

The "detection light" mentioned in embodiments of this application refers to the light signal configured to detect a target object, which is part of the source light signal generated by the light source module in the LiDAR; the "echo light" mentioned in embodiments of this application refers to the light signal formed by the target object reflecting the detection light, which is directed towards the LiDAR by the target object, and the echo light is received by the silicon photonic chip in the LiDAR; the "target object" mentioned in embodiments of this application refers to the object detected by the detection light, including people, vehicles, vegetation, buildings, and the ground.

Regarding the cladding 110, refer to FIG. 1. The cladding 110 is one of the main structures constituting the silicon photonic chip 100 and is also the structure to which the transceiving waveguide module 120, the first photoelectric detection module 150, and the first polarization rotator 130 are attached. The cladding 110 can be made of materials such as silicon dioxide and/or silicon oxynitride.

Regarding the transceiving waveguide module 120, referring to FIG. 1, the transceiving waveguide module 120 is embedded in the cladding 110, and the refractive index of the transceiving waveguide module 120 is greater than that of the cladding 110. The transceiving waveguide module 120 and the cladding 110 together form a structure that allows stable light transmission, meaning that light can be transmitted along the transceiving waveguide module 120 without easily leaking out of the silicon photonic chip 100 through the cladding 110. In an embodiment, the cladding 110 is made of silicon dioxide, the transceiving waveguide module 120 can be made of silicon with a greater refractive index, or it is made of other materials with a refractive index greater than that of the cladding 110, such as silicon nitride. The transceiving waveguide module 120 includes the emitting waveguide 121 and the first receiving waveguide 122.

The emitting waveguide 121 extends along the illustrated first direction A and is configured to transmit and emit detection light, to detect a target object. The emitting waveguide 121 has an emission end face perpendicular to the first direction A, through which the detection light passes and projects onto the target object.

The first receiving waveguide 122 extends along the first direction A and is arranged at intervals with the emitting waveguide 121 along the second direction B. The first receiving waveguide 122 is configured to receive and transmit echo light. The first receiving waveguide 122 includes an input end and an output end. The input end of the first receiving waveguide 122 has a first receiving end face through which the echo light enters the first receiving waveguide 122 and is output downstream from the output end of the first receiving waveguide 122. The emitting waveguide 121 and the first receiving waveguide 122 can be located in the same layer of the silicon photonic chip 100 or in different layers, as long as the distance between them in the thickness direction of the silicon photonic chip 100 allows the first receiving waveguide 122 to receive the echo light.

As the LiDAR generally includes a scanning module that receives and reflects the detection light output by the silicon photonic chip 100, the scanning module can rotate relative to the silicon photonic chip 100. The detection light emitted outside the LiDAR forms a detection field of view. As the scanning module is a movable component, when the echo light returns to the scanning module, it has already rotated to an angle, causing the echo light to land on the silicon photonic chip 100 at a position different from the original light emission position of the emitting waveguide 121, i.e., the light spot of the echo light is offset from the light spot position when the detection light was emitted. The offset distance is related to the flight time or distance of the light signal during detection. The greater the flight time or distance of the light signal, the greater the offset distance. The offset direction is related to the scanning direction of the scanning module. Since the first receiving waveguide 122 receives the echo light, the offset direction is the second direction B, or the main offset direction is the second direction B, so that the first receiving waveguide 122 can smoothly receive the echo light. The above effect is referred to as the walk-off effect of the LiDAR.

Regarding the first photoelectric detection module 150, refer to FIG. 1. The first photoelectric detection module 150 is arranged downstream of the first receiving waveguide 122 in the light path of the echo light, and is configured to receive the first local oscillator light and the echo light output by the first receiving waveguide 122. In this way, the first local oscillator light and the echo light beat at the first photoelectric detection module 150 to generate a beat frequency light signal. The first photoelectric detection module 150 is also configured to convert the beat frequency light signal into a corresponding electrical signal. In an embodiment, the detection light and the first local oscillator light derived from the source light signal generated by the light source module of the LiDAR have the same characteristics except for different energy levels. In an embodiment, the detection light and the first local oscillator light have the same polarization direction.

FIG. 1 shows a schematic diagram of a specific implementation of the silicon photonic chip. The first photoelectric detection module 150 includes a first optical mixer 151 and a first balanced photoelectric detector 152. The first optical mixer 151 is configured to receive the first local oscillator light and the echo light output by the first receiving waveguide 122 and mix them to output a first beat frequency light signal and a second beat frequency light signal. The first balanced photoelectric detector 152 is connected to the first optical mixer 151, and is configured to perform balanced detection on the first beat frequency light signal and the second beat frequency light signal and output a first beat frequency signal.

In an embodiment, the first optical mixer 151 of the first photoelectric detection module 150 has two input ports. One input port is configured to receive the first local oscillator light, and the other one is configured to receive the echo light. In this way, the first local oscillator light and the echo light can beat in the first optical mixer 151 to obtain two beat frequency light signals, namely the first beat frequency light signal and the second beat frequency light signal. In an embodiment, the first optical mixer 151 is a 180-degree mixer, and the output two light signals have a phase difference of 180 degrees. The first balanced photoelectric detector 152 is connected to the two output ends of the first optical mixer 151 and is configured to perform balanced detection on the first beat frequency light signal and the second beat frequency light signal and output the first beat frequency signal. The frequency of the first beat frequency signal is the same as that of the first/second beat frequency light signal. The first photoelectric detection module 150 can receive the first local oscillator light and the echo light and convert the beat frequency light signal generated by their beating into an electrical signal. In an embodiment, the first photoelectric detection module 150 includes a photoelectric detector. This photoelectric detector is configured to receive the first local oscillator light and the echo light to beat them and convert the resulting beat frequency light signal into an electrical signal, i.e., the first beat frequency signal.

Coherent beating is sensitive to the polarization direction, i.e., two light signals with the same polarization direction can beat. Since the echo light's polarization direction is no longer single after being reflected by the target object, the echo light includes components in various polarization directions, such as transverse electric (TE) mode components, transverse magnetic (TM) mode components, and other components between these two polarization directions. After entering the first receiving waveguide 122, the TE components maintain their polarization direction. The TM components maintain their polarization direction, and the other components decompose into TE components and TM components. Therefore, the echo light transmitted in the first receiving waveguide 122 includes TE and TM components. The components of the TE and TM components that have the same polarization direction as the first local oscillator light will beat with the first local oscillator light. The precursor light is transmitted to the first photoelectric detection module 150 along with the echo light after entering the first receiving waveguide 122. In an embodiment, since the polarization direction of the detection light is the same as that of the first local oscillator light, the precursor light can beat with the first local oscillator light, thereby affecting the beating of the echo light and the first local oscillator light and impacting the detection accuracy of the LiDAR 200.

Regarding the first polarization rotator 130, refer to FIG. 1. The first polarization rotator 130 is arranged upstream of the first photoelectric detection module 150 and is configured to perform a 90° polarization rotation on the echo light output by the first receiving waveguide 122. This causes the echo light to beat with the first local oscillator light after polarization rotation. The first polarization rotator 130 is connected to the output end of the first receiving waveguide 122 and can receive the echo light output by the first receiving waveguide 122 and rotate its polarization direction by 90 degrees. Since the precursor light and the echo light are both transmitted in the first receiving waveguide 122, the first polarization rotator 130 rotates the polarization direction of both the precursor light and the echo light by 90 degrees. This rotation causes the polarization direction of the precursor light to be perpendicular to the first local oscillator light, preventing the precursor light from beating with the first local oscillator light. For the echo light, after rotating its overall polarization direction by 90 degrees, the echo light transmitted to the first photoelectric detection module 150 still includes TE and TM components. The components of the TE and TM components with the same polarization direction as the first local oscillator light will beat with the first local oscillator light. Although the precursor light still enters the first receiving waveguide 122 and is transmitted to the first photoelectric detection module through it, it does not affect the beating of the echo light and the first local oscillator light.

In an embodiment, taking the detection light and the first local oscillator light both as TE light, the precursor light generated by the reflection of the detection light at the emission end face of the emitting waveguide 121 is also TE light. The echo light includes TE and TM components. After polarization rotation by the first polarization rotator 130, the precursor light becomes TM light, the TE component of the echo light becomes the TM component, and the TM component of the echo light becomes the TE component. The first local oscillator light entering the first optical mixer 151 is TE light, while the precursor light is TM light. The polarization direction of the precursor light is perpendicular to that of the first local oscillator light, so they do not beat. The TE component of the echo light after polarization rotation has the same polarization direction as the first local oscillator light, so it can beat with the first local oscillator light. The TM component of the echo light after polarization rotation has a polarization direction perpendicular to that of the first local oscillator light, so it does not beat with the first local oscillator light. The arrangement of the first polarization rotator 130 connected to the output end of the first receiving waveguide 122 can effectively prevent the precursor light from interfering with the coherent reception of the first local oscillator light and the echo light.

Figure 2:
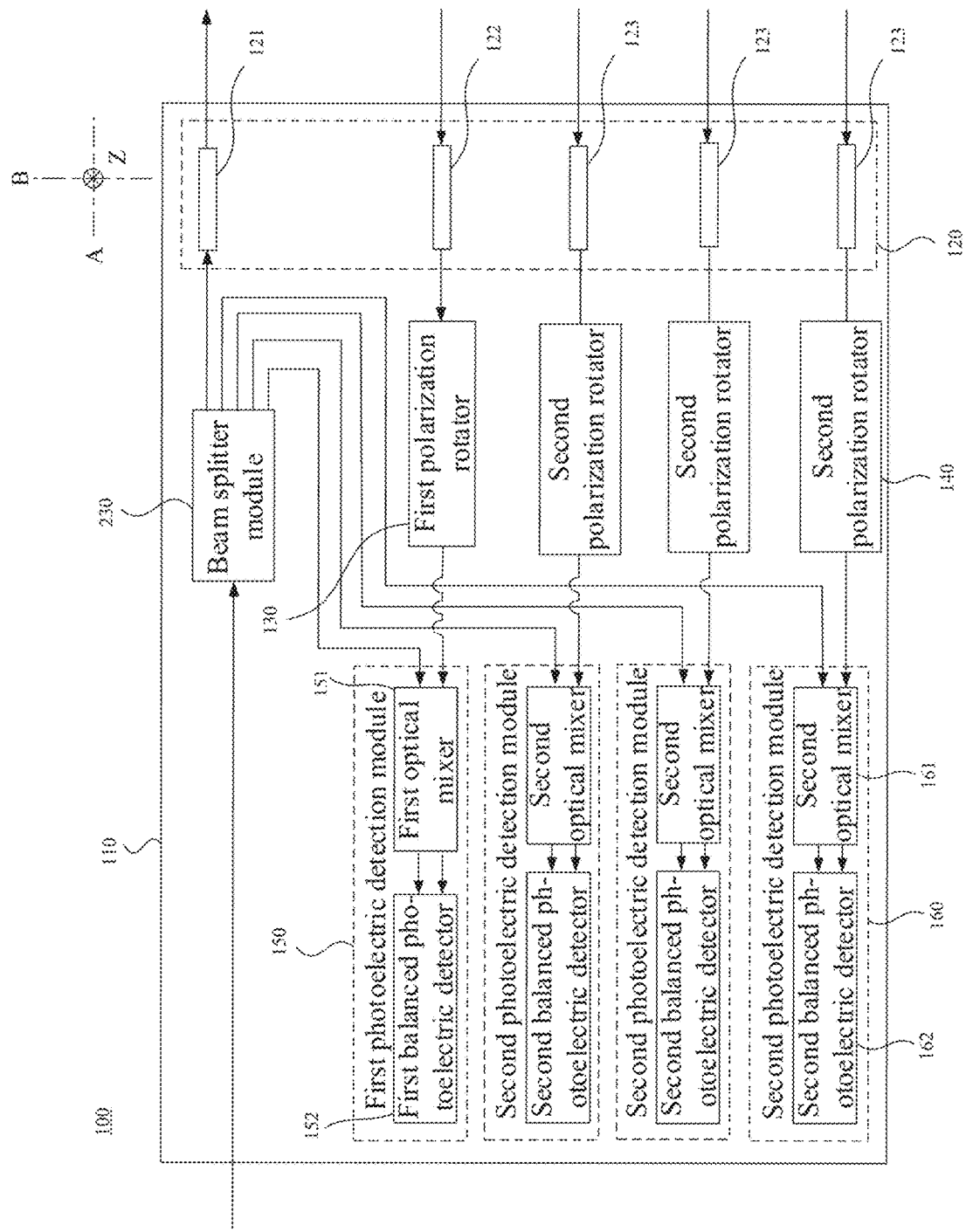
FIG. 2 is a schematic structural diagram of a silicon photonic chip with the second polarization rotator connected to the second receiving waveguide according to an embodiment.

FIG. 2 is a schematic structural diagram of a silicon photonic chip with the second polarization rotator connected to the second receiving waveguide according to an embodiment.

Referring to FIG. 2, a single first receiving waveguide 121 has a limited range for receiving echo light in an embodiment. The transceiving waveguide module 120 includes at least one second receiving waveguide 123. The silicon photonic chip 100 includes at least one second photoelectric detection module 160. Viewed along the thickness direction Z, the emitting waveguide 121, the first receiving waveguide 122, and the second receiving waveguide 123 are arranged at intervals along the second direction B. The second receiving waveguide 123 is located on the side of the first receiving waveguide 122 away from the emitting waveguide 121 and is configured to receive and transmit echo light. The second receiving waveguide 123 includes an input end and an output end. The input end of the second receiving waveguide 123 has a second receiving end face through which the echo light enters the second receiving waveguide 123 and is output downstream from the output end of the second receiving waveguide 123. The second receiving waveguide 123 and the first receiving waveguide 122 together form a waveguide array for receiving echo light. This arrangement increases the receiving area for echo light, thereby enabling the reception of echo light with a greater offset, improving the detection distance of the LiDAR.

The second photoelectric detection module 160 is arranged downstream of the first receiving waveguide 122 in the light path of the echo light, and is configured to receive the second local oscillator light and the echo light output by the second receiving waveguide 123. In this way, the second local oscillator light and the echo light beat at the second photoelectric detection module 150 to generate a beat frequency light signal. The second photoelectric detection module 150 is configured to convert the beat frequency light signal into a corresponding electrical signal. The quantity of second photoelectric detection modules 160 can be equal to and correspond one-to-one with the quantity of second receiving waveguides 123. Each second photoelectric detection module 160 is configured to receive one beam of the second local oscillator light and the echo light output by the corresponding second receiving waveguide 123.

The second photoelectric detection module 160 includes a second optical mixer 161 and a second balanced photoelectric detector 162. The second optical mixer 161 is configured to receive the second local oscillator light and the echo light output by the second receiving waveguide 123 and mix them to output a third beat frequency light signal and a fourth beat frequency light signal. The second balanced photoelectric detector 162 is connected to the second optical mixer 161 and is configured to perform balanced detection on the third beat frequency light signal and the fourth beat frequency light signal. The second optical mixer 161 can be the same optical mixer as the first optical mixer 151, allowing the second local oscillator light and the echo light to beat in it. The second balanced photoelectric detector 162 can be the same balanced photoelectric detector as the first balanced photoelectric detector 152, configured to perform balanced detection on the third beat frequency light signal and the fourth beat frequency light signal and output the second beat frequency signal.

The precursor light may enter not only the first receiving waveguide 122 but also the more distant second receiving waveguide 123. In an embodiment, as shown in FIG. 2, the silicon photonic chip 100 includes at least one second polarization rotator 140. Each second polarization rotator 140 corresponds to one second photoelectric detection module 160. The second polarization rotator 140 is arranged upstream of the corresponding second photoelectric detection module 160 and is configured to perform a 90° polarization rotation on the echo light output by the corresponding second receiving waveguide 123. In an embodiment, the second polarization rotator 140 is connected to the output end of the corresponding second receiving waveguide 123 and can receive the echo light output by the corresponding second receiving waveguide 123 and rotate its polarization direction by 90 degrees. In an embodiment, the transceiving waveguide module 120 includes multiple second receiving waveguides 123. The silicon photonic chip 100 includes multiple second polarization rotators 140, and a quantity of second polarization rotators 140 is equal to and corresponds one-to-one with a quantity of second receiving waveguides 123. Each second polarization rotator 140 rotates the polarization direction of the echo light output by the corresponding second receiving waveguide 123 by 90 degrees and outputs it to the second photoelectric detection module 160. In an embodiment, the transceiving waveguide module 120 includes multiple second receiving waveguides 123, the silicon photonic chip 100 includes at least one second polarization rotator 140, and a quantity of second polarization rotators 140 is less than a quantity of second receiving waveguides 123. In an embodiment, the second polarization rotator 140 can be arranged corresponding to the second receiving waveguide 123 adjacent to the first receiving waveguide 122, and each second polarization rotator 140 corresponds to one second receiving waveguide 123. Each second polarization rotator 140 rotates the polarization direction of the echo light output by the corresponding second receiving waveguide 123 by 90 degrees and outputs it to the second photoelectric detection module 160.

Regarding the first local oscillator light and the second local oscillator light, the structure of the silicon photonic chip 100 is diverse. In an embodiment, as shown in FIGS. 1 and 2, the silicon photonic chip 100 includes a beam splitter module 230. The beam splitter module 230 includes a first input end, a first output end, a second output end, and at least one third output end. The first output end is connected to the emitting waveguide 121, the second output end is connected to the first photoelectric detection module 150, and the third output end is connected to the second photoelectric detection module 160. The beam splitter module 230 is configured to receive the source light signal generated by the light source module of the LiDAR through the first input end and output the detection light through the first output end to transmit the detection light to the emitting waveguide 121. It outputs the first local oscillator light through the second output end to transmit the first local oscillator light to the first photoelectric detection module 150, and outputs the second local oscillator light through the third output end to transmit the second local oscillator light to the second photoelectric detection module 160. The beam splitter module 230 can include a single beam splitter or multiple cascaded beam splitters, as long as it can split the source light signal into the detection light, the first local oscillator light, and the second local oscillator light. Additionally, even if this embodiment describes the detection light, the first local oscillator light, and the second local oscillator light as being split on the silicon photonic chip 100. In some embodiments, the detection light can be split outside the silicon photonic chip 100, with the detection light entering the silicon photonic chip through an interface. The first local oscillator light and the second local oscillator light can be received as a single signal through another interface and then split, or the first local oscillator light and the second local oscillator light can be split outside the silicon photonic chip 100 and enter the silicon photonic chip through their respective interfaces.

In embodiments of this application, the polarization direction of the precursor light and the echo light output by the first receiving waveguide 122 is rotated by 90 degrees, thereby rotating the polarization direction of the precursor light to be perpendicular to the first local oscillator light, preventing the precursor light from beating with the first local oscillator light. Regarding the echo light, after rotating its overall polarization direction by 90 degrees, the echo light transmitted to the first photoelectric detection module 150 still includes TE and TM components. The components of the TE and TM components with the same polarization direction as the first local oscillator light will beat with the first local oscillator light. The precursor light still enters the first receiving waveguide 122 and is transmitted to the first photoelectric detection module through it, it does not affect the beating of the echo light and the first local oscillator light. Therefore, the silicon photonic chip 100 provided by the embodiment of this application can effectively prevent the precursor light from interfering with the coherent reception of the first local oscillator light and the echo light.

Figure 3:
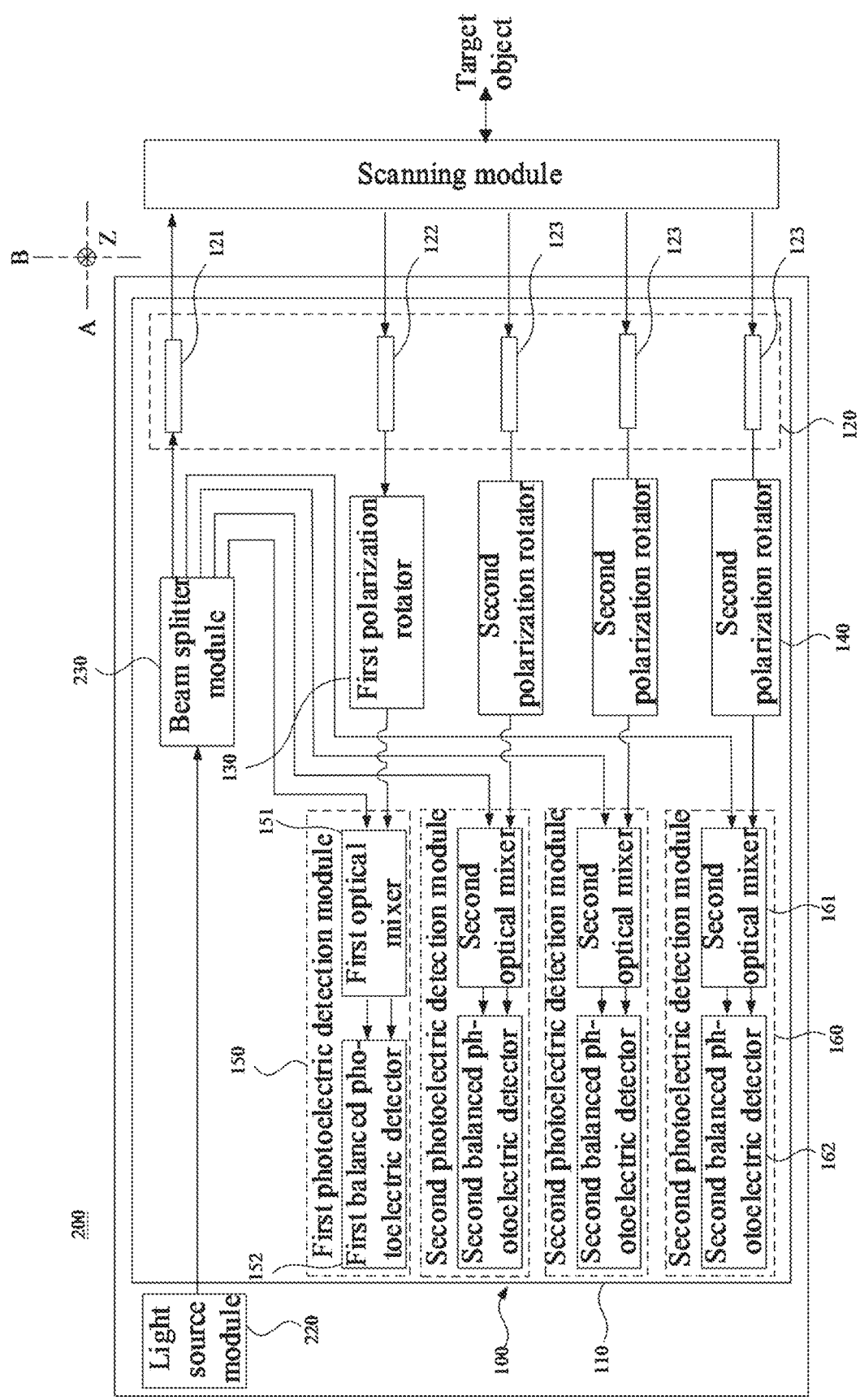
FIG. 3 is a system architecture diagram of a silicon photonic chip applied to a LiDAR according to an embodiment.

FIG. 3 is a system architecture diagram of a silicon photonic chip applied to a LiDAR according to an embodiment.

In a second aspect, an embodiment of this application provides a LiDAR 200. Referring to FIG. 3, the LiDAR 200 includes a housing 210, a light source module 220, and silicon photonic chip 100 described in the previous embodiments (shown in FIG. 3 as including the silicon photonic chip in FIG. 2). The housing 210 serves as the installation substrate for other components in the LiDAR and provides protection for these components. The light source module 220 is configured to generate a source light signal. The silicon photonic chip 100 is housed in the housing 210 and is configured to transmit and emit detection light to detect a target object, where the detection light is part of the source light signal. The silicon photonic chip 100 is configured to receive the echo light formed by the target object reflecting the detection light and transmit the first local oscillator light for coherent detection of the LiDAR 200. The first local oscillator light is part of the source light signal. Accordingly, the housing 210 has a light-transmitting area for the detection light and the echo light to pass through. The detection light and the first local oscillator light can be split on the silicon photonic chip 100 using the beam splitter module 230 or split outside the silicon photonic chip 100, as long as the silicon photonic chip 100 can transmit the signals.

In an embodiment, by using the silicon photonic chip 100, the first polarization rotator 130 of the silicon photonic chip 100 is configured to perform a 90° polarization rotation on the echo light output by the first receiving waveguide 122, making the polarization direction of the detection light emitted by the emitting waveguide 121 perpendicular to the polarization direction of the echo light after polarization rotation, preventing the precursor light generated at the emitting waveguide 121 from entering the first photoelectric detection module 150 and causing interference, thereby effectively improving the detection accuracy of the LiDAR 200.

Figure 4:
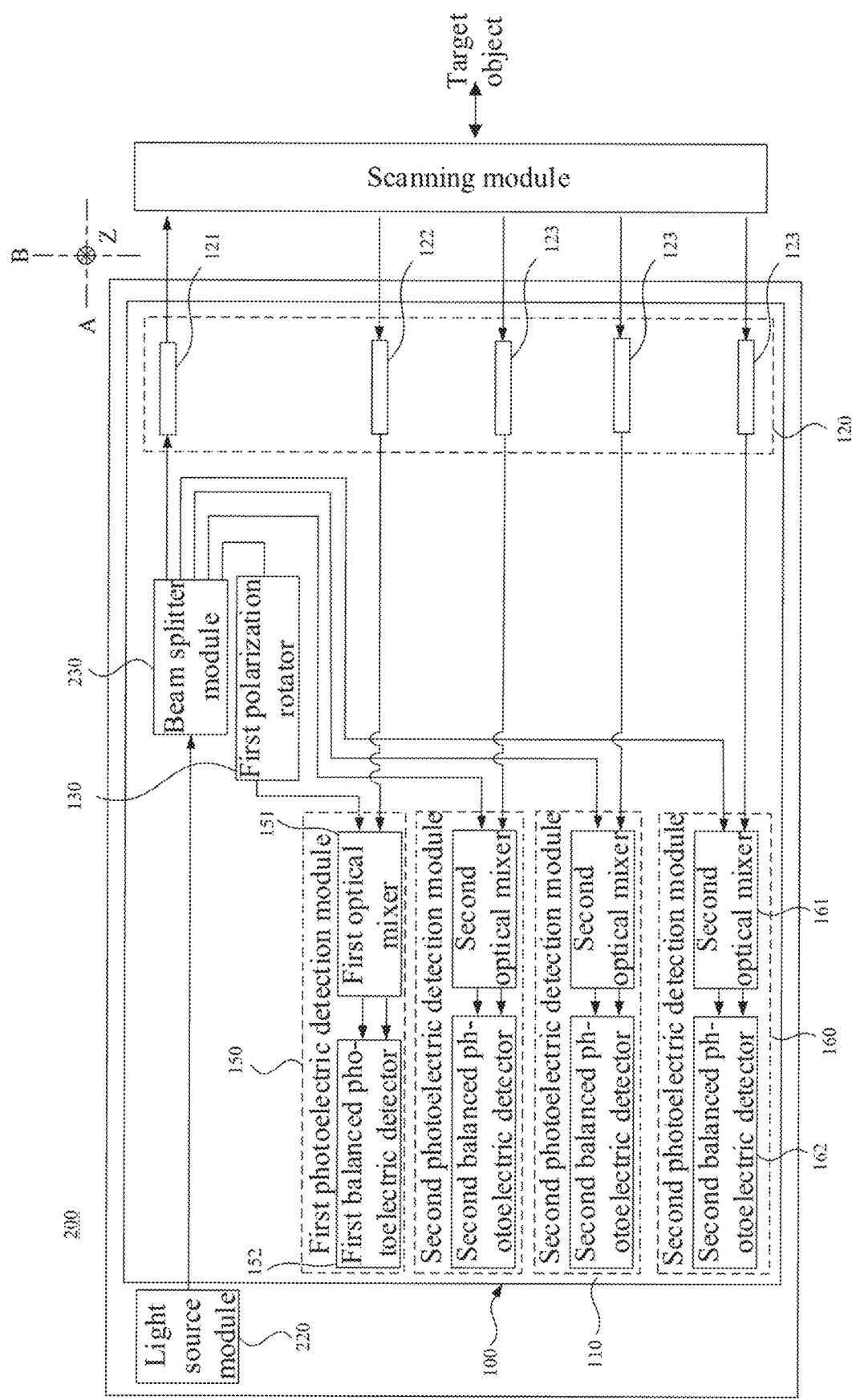
FIG. 4 is a system architecture diagram of a LiDAR with the first polarization rotator connected to the second output end according to an embodiment.

FIG. 4 is a system architecture diagram of a LiDAR with the first polarization rotator connected to the second output end according to an embodiment.

In a third aspect, an embodiment of this application provides a LiDAR 200, as shown in FIG. 4. This LiDAR 200 includes the housing 210, the light source module 220, and the silicon photonic chip 100. The embodiment shown in FIG. 4 does not use a polarization rotator to change the polarization direction of the precursor light and the echo light between the first photoelectric detection module 150 and the first receiving waveguide 122. It configures the light source module 220 and/or the silicon photonic chip 100 such that the polarization direction of the first local oscillator light received by the first photoelectric detection module 150 is perpendicular to the polarization direction of the detection light. The polarization direction of the precursor light generated by the reflection of the detection light at the emission end face of the emitting waveguide 121 is perpendicular to the first local oscillator light, preventing the precursor light from interfering with the beating of the first local oscillator light and the echo light.

In an embodiment, referring to FIG. 4, the silicon photonic chip 100 includes the first polarization rotator 130, but it is not arranged between the first receiving waveguide 122 and the first photoelectric detection module 150. It is arranged in another optical path connected to the first photoelectric detection module 150. This polarization rotator is arranged upstream of the first photoelectric detection module 150 and is configured to perform a 90° polarization rotation on the first local oscillator light received by the first photoelectric detection module 150.

In an embodiment, the silicon photonic chip 100 includes the cladding 110, the transceiving waveguide module 120, the first photoelectric detection module 150, the first polarization rotator 130, and the beam splitter module 230. The cladding 110, the transceiving waveguide module 120, the first photoelectric detection module 150, and the beam splitter module 230 respectively correspond to the cladding 110, the transceiving waveguide module 120, the first photoelectric detection module 150, and the beam splitter module 230 in the previous embodiments.

The first polarization rotator 130 is arranged between the second output end of the beam splitter module 230 and the first photoelectric detection module 150. The arrangement of the first polarization rotator 130 ensures that the first local oscillator light received by the first photoelectric detection module 150 has a polarization direction perpendicular to that of the detection light, preventing the precursor light from interfering with the first local oscillator light and the echo light beating coherently.

Figure 5:
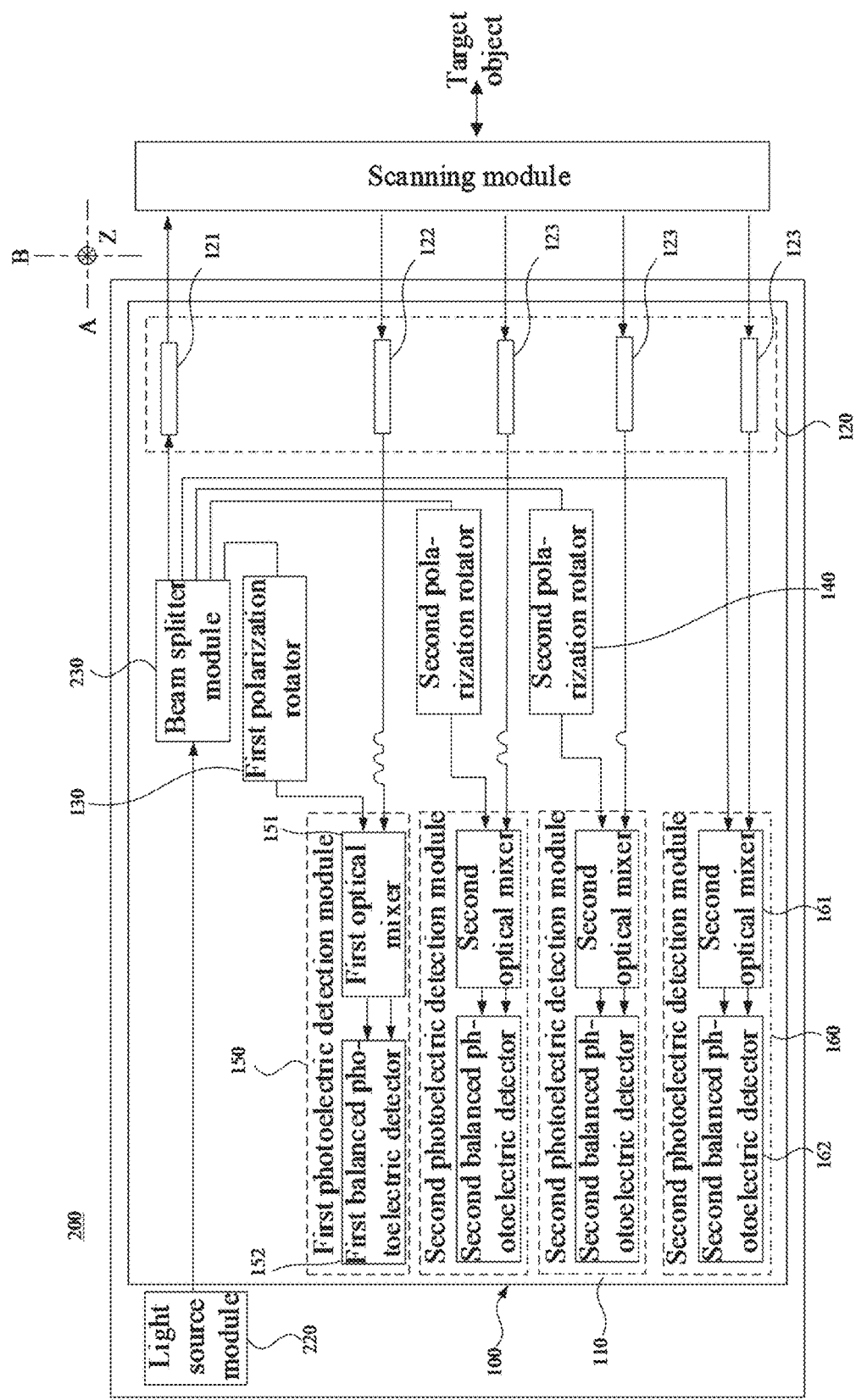
FIG. 5 is a system architecture diagram of a LiDAR with the second polarization rotator connected to the third output end according to an embodiment.

FIG. 5 is a system architecture diagram of a LiDAR with the second polarization rotator connected to the third output end according to an embodiment.

Referring to FIG. 5, an embodiment differs from the embodiment shown in FIG. 4 in that the silicon photonic chip 100 includes at least one second polarization rotator 140. The difference between this embodiment and the embodiment without the second polarization rotator 140 is that the second polarization rotator 140 is not arranged at the output end of the second receiving waveguide 123 but is arranged between the third output end of the beam splitter module 260 and the second photoelectric detection module 140.

Figure 6:
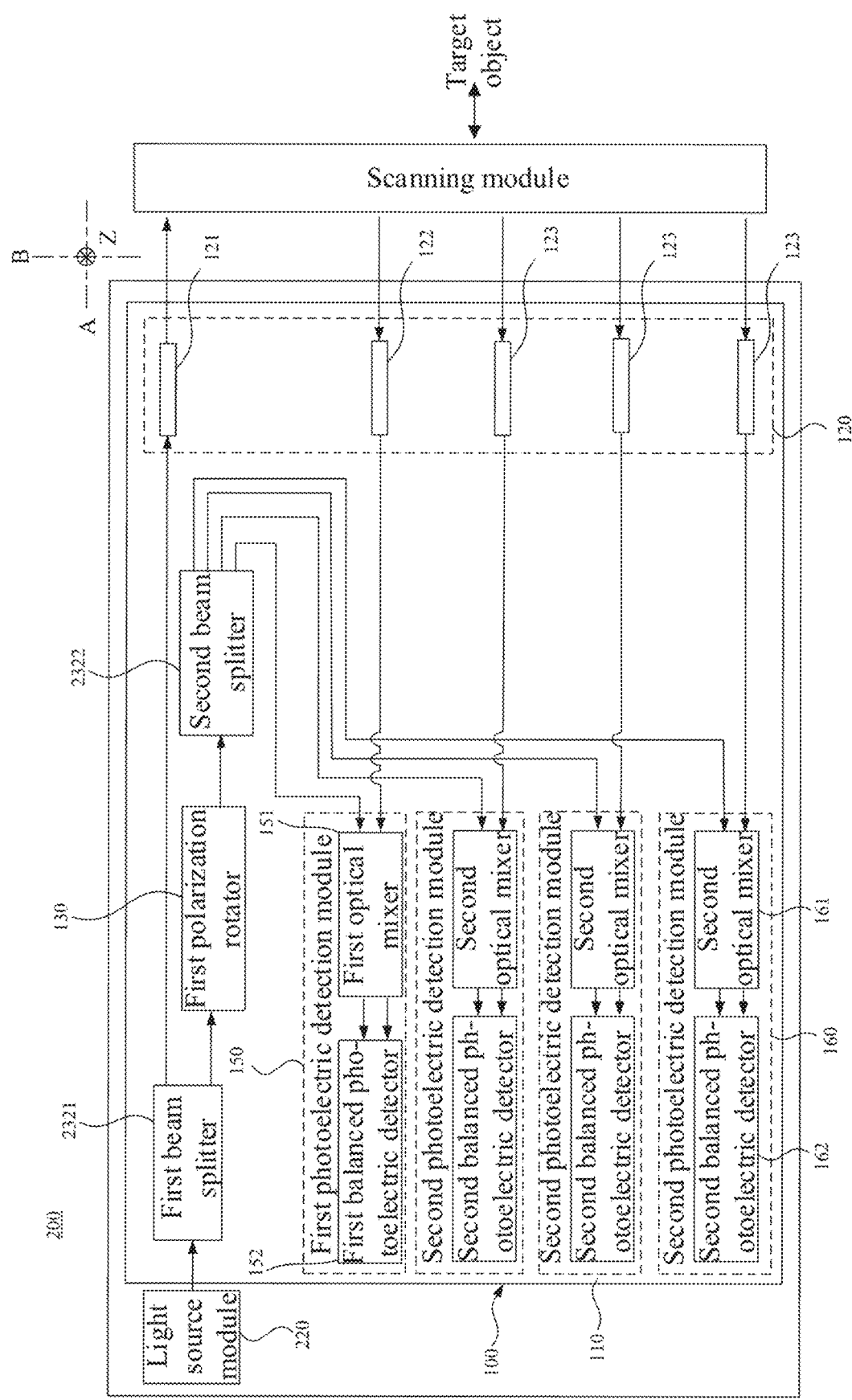
FIG. 6 is a system architecture diagram of a LiDAR with the first polarization rotator connected between the cascaded output end and the second input end according to an embodiment.

FIG. 6 is a system architecture diagram of a LiDAR with the first polarization rotator connected between the cascaded output end and the second input end according to an embodiment.

In an embodiment, referring to FIG. 6, the silicon photonic chip 100 uses a single first polarization rotator 130 to achieve the polarization rotation of both the first local oscillator light and the second local oscillator light. In an embodiment, the beam splitter module 230 includes cascaded first beam splitter 2321 and second beam splitter 2322. The first beam splitter 2321 includes a first input end, a first output end, and a cascaded output end. The first beam splitter 2321 is configured to receive the source light signal through the first input end and output the detection light through the first output end and the local oscillator light through the cascaded output end. The second beam splitter 2322 has a second input end, a second output end, and at least one third output end. The second input end is connected to the cascaded output end, and the second output end is connected to the first photoelectric detection module. The third output end is connected to the second photoelectric detection module. The second beam splitter 2322 is configured to receive the local oscillator light through the second input end and output the first local oscillator light through the second output end and the second local oscillator light through the third output end. The first polarization rotator 130 is arranged between the cascaded output end and the second input end. Since the first polarization rotator 130 is arranged upstream of the first photoelectric detection module 150 and each second photoelectric detection module 160, it can perform polarization rotation on both the first local oscillator light and the second local oscillator light, saving on polarization rotators compared to the embodiment shown in FIG. 4.

The embodiments shown in FIGS. 4 to 6 illustrate using a polarization rotator 130 in the optical path of the first local oscillator light to ensure that the polarization direction of the first local oscillator light is perpendicular to that of the detection light.

Figure 7:
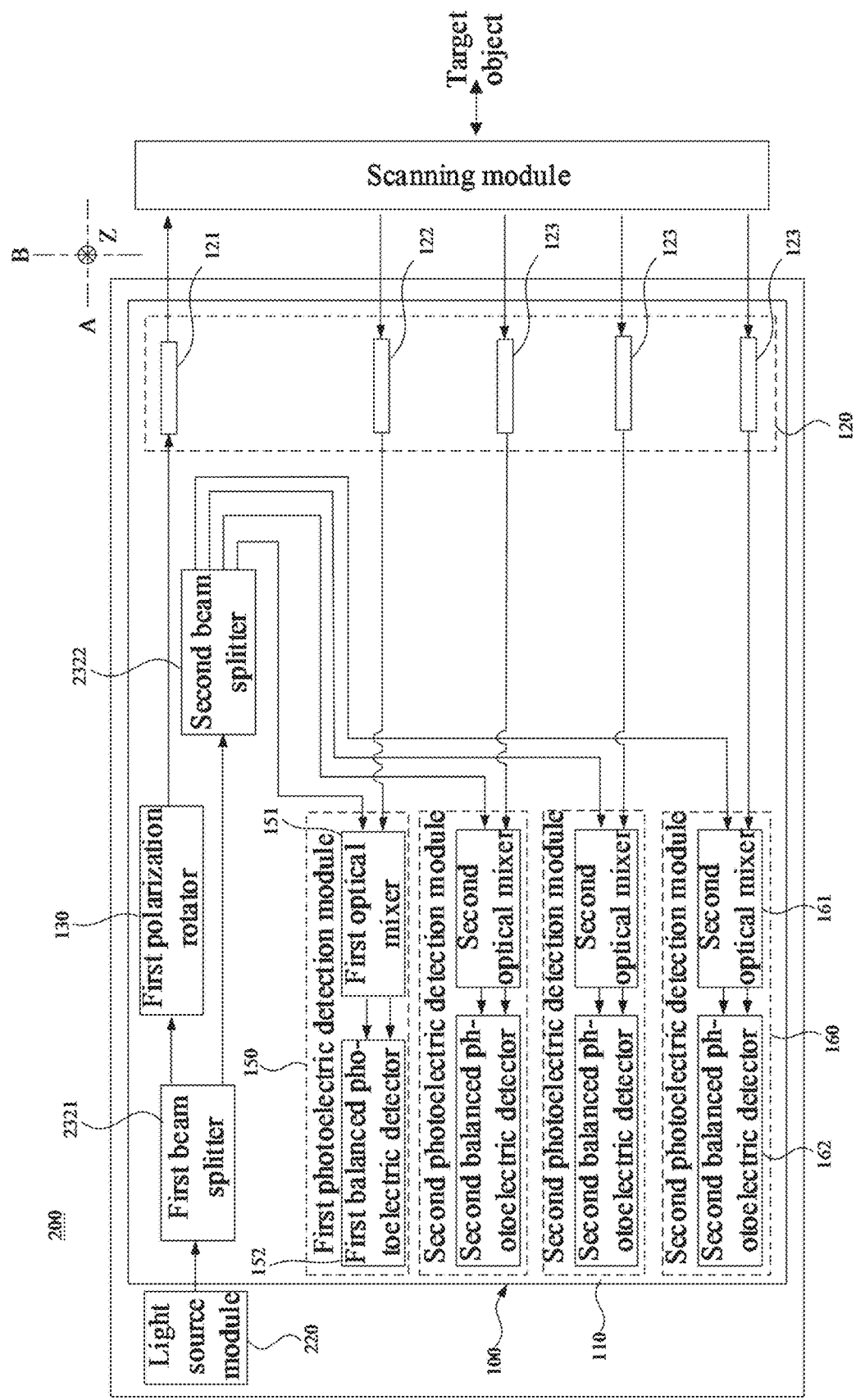
FIG. 7 is a system architecture diagram of a LiDAR with the first polarization rotator connected to the emitting waveguide according to an embodiment.

FIG. 7 is a system architecture diagram of a LiDAR with the first polarization rotator connected to the emitting waveguide according to an embodiment.

In an embodiment, referring to FIG. 7, the LiDAR shown in FIG. 7 does not include a polarization rotator 130 in the optical path of the first local oscillator light and the second local oscillator light. The polarization rotator 130 is connected to the emitting waveguide 121. In an embodiment, the embodiment in FIG. 7 has the detection light and the first local oscillator light obtained by beam splitting through the beam splitter module 230. The polarization rotator 130 is connected between the first output end of the beam splitter module 230 and the emitting waveguide 121. Since the polarization directions of the detection light and the first local oscillator light are different, the precursor light does not interfere with the coherent beating of the first local oscillator light and the echo light.

In an embodiment, it is configured that the detection light and the first local oscillator light have different polarization directions outside the silicon photonic chip 100 and then allow them to enter the silicon photonic chip 100 separately. This configuration also has the same technical effect. However, configuring them on the silicon photonic chip 100 ensures a higher integration level for the LiDAR 200.

Figure 8:
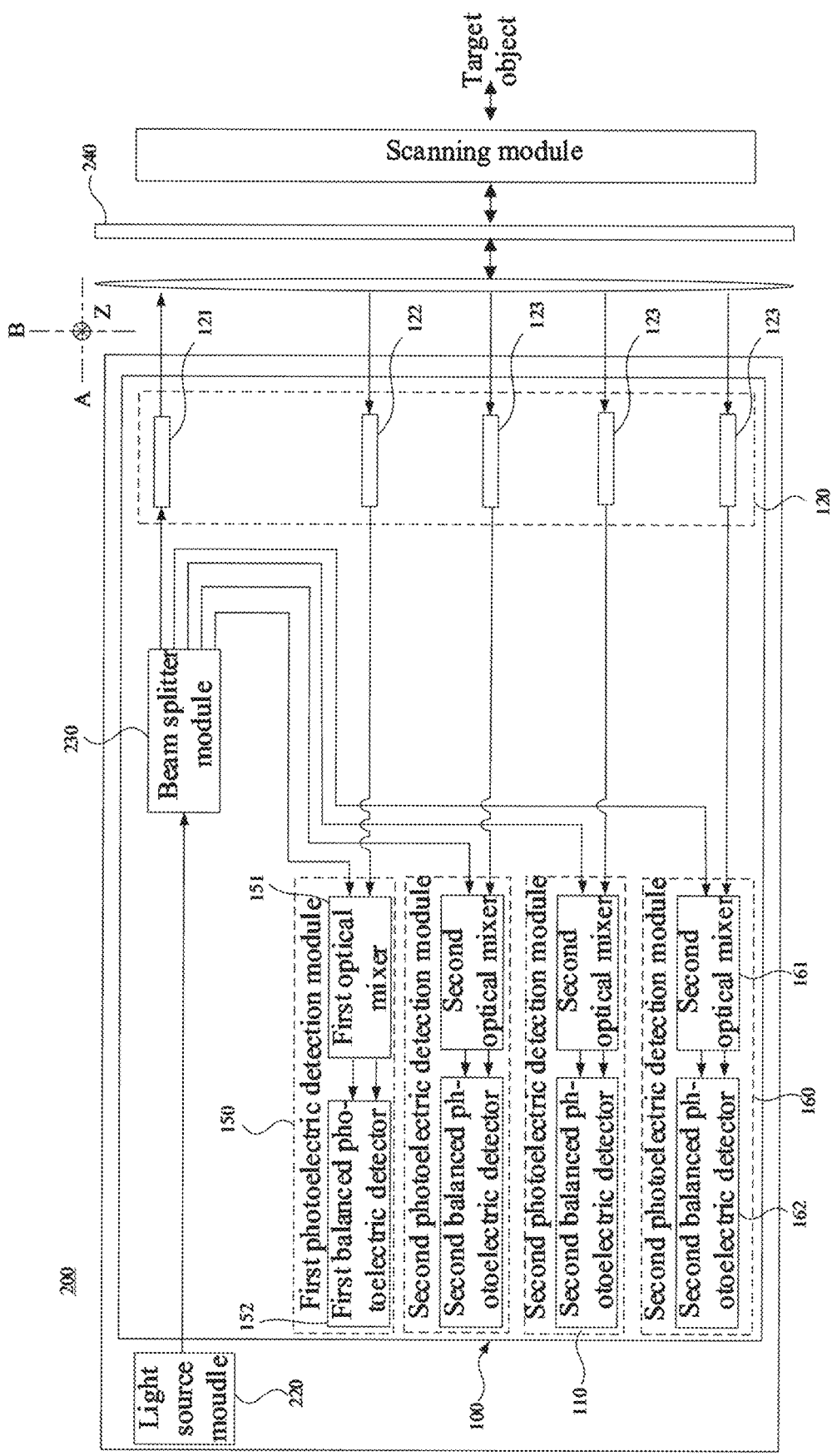
FIG. 8 is a system architecture diagram of a LiDAR including a quarter wave plate according to an embodiment.

FIG. 8 is a system architecture diagram of a LiDAR including a quarter wave plate according to an embodiment.

In an embodiment, as shown in FIG. 8, the LiDAR 200 includes a quarter wave plate 240. The quarter wave plate 240 is arranged at one end of the emitting waveguide 121 for emitting the detection light and the first receiving waveguide 122 for receiving the echo light. It is configured to convert the detection light into an elliptically polarized or circularly polarized light signal. The light passing through the quarter wave plate 240 can be rotated by the same angle. In an embodiment, the detection light is rotated by 45 degrees when passing through the quarter wave plate 240, and the echo light is rotated by 45 degrees when passing through the quarter wave plate 240. The detection light passes through the quarter wave plate 240 and is projected onto the target object, and the echo light formed by the reflection of the target object passes through the quarter wave plate 240 again, forming echo light with a polarization direction perpendicular to the detection light. When the first polarization rotator 130 is arranged at the output end of the first receiving waveguide 122, due to the rotation process of the quarter wave plate 240, the higher energy component in the first receiving waveguide 122 is the component perpendicular to the detection light, which is the light signal with a different polarization direction from the detection light and the precursor light. This configuration helps to ensure higher echo energy beating with the first local oscillator light.

Figure 9:
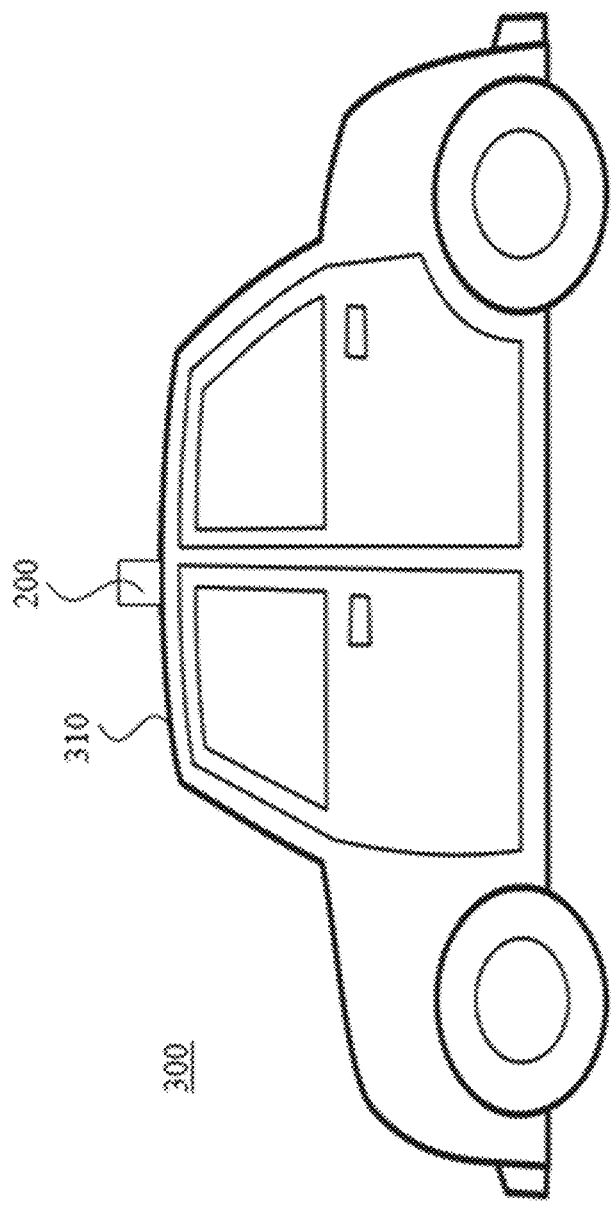
FIG. 9 is a schematic structural diagram of a mobile device according to an embodiment.

FIG. 9 is a schematic structural diagram of a mobile device according to an embodiment.

In a fourth aspect, an embodiment of this application provides a mobile device. Referring to FIG. 9, the mobile device 300 is a device that can move relative to the ground, including a movable substrate 310 and a LiDAR 200 mounted on the substrate.

The mobile device 300 includes but is not limited to vehicles with six levels of autonomous driving technology defined by the Society of Automotive Engineers International (SAE International) or the Chinese national standard "Classification of Automobile Driving Automation," such as the following:
- (1) Passenger vehicles, such as family cars, buses, etc.;
- (2) Cargo vehicles, such as ordinary trucks, vans, trailers, enclosed trucks, tank trucks, flatbed trucks, container trucks, dump trucks, special structure trucks, etc.;
- (3) Utility vehicles, such as logistics delivery vehicles, automated guided vehicles (AGVs), patrol vehicles, cranes, excavators, bulldozers, loaders, rollers, loaders, off-road engineering vehicles, armored engineering vehicles, sewage treatment vehicles, sanitation vehicles, vacuum sweepers, floor sweepers, lawn mowers, golf carts, etc.;
- (4) Entertainment vehicles, such as amusement park rides, balancing vehicles, etc.; and
- (5) Special rescue vehicles, such as fire trucks, ambulances, power repair vehicles, engineering rescue vehicles, etc.

In the drawings of this embodiment, similar or identical reference numerals correspond to similar or identical parts. In the description of this application, if there are terms indicating orientation or positional relationships, such as "upper," "lower," "left," "right," etc., they are based on the orientation or positional relationships shown in the drawings. These terms are configured to facilitate the description of this application and simplify the description, rather than indicating or implying that the device or element must have a specific orientation, be constructed, or operate in a specific orientation.

What is claimed is:

1. A silicon photonic chip, comprising:
   a cladding;
   a transceiving waveguide module, embedded in the cladding and comprising an emitting waveguide and a first receiving waveguide, wherein the emitting waveguide extends along a first direction, the emitting waveguide is configured to transmit and emit a detection light for detecting a target object, and when viewed along a thickness direction of the silicon photonic chip, the first receiving waveguide is arranged at intervals with the emitting waveguide along a second direction, the first receiving waveguide is configured to receive and transmit an echo light, and the echo light is formed by the detection light being reflected by the target object;
   a first photoelectric detection module, configured to receive a first local oscillator light and the echo light output by the first receiving waveguide; and
   a first polarization rotator, disposed upstream of the first photoelectric detection module and configured to perform 90° polarization rotation on a precursor light and the echo light output by the first receiving waveguide, wherein the precursor light output by the first receiving waveguide is formed by a partial signal of the detection light being reflected by an emission end face of the emitting waveguide and/or an end face of the cladding, and entering the first receiving waveguide,
   wherein any two of the first direction, the second direction, and the thickness direction are perpendicular to each other.

2. The silicon photonic chip according to claim 1, wherein the transceiving waveguide module further comprises at least a second receiving waveguide;
   wherein the emitting waveguide, the first receiving waveguide, and the second receiving waveguide are arranged at intervals along the second direction when viewed along the thickness direction, the second receiving waveguide is located on a side of the first receiving waveguide away from the emitting waveguide, and the second receiving waveguide is configured to receive and transmit the echo light; and
   wherein the silicon photonic chip further comprises at least a second photoelectric detection module, each second photoelectric detection module corresponds to a second receiving waveguide, and each second photoelectric detection module is configured to receive a second local oscillator light and the echo light output by the second receiving waveguide.

3. The silicon photonic chip according to claim 2, further comprising at least one second polarization rotator, each second polarization rotator is arranged corresponding to each second photoelectric detection module,
   wherein the second polarization rotator is disposed upstream of a corresponding second photoelectric detection module, and is configured to perform 90° polarization rotation on a precursor light and the echo light output by a corresponding second receiving waveguide, wherein the precursor light output by the corresponding second receiving waveguide is formed by a partial signal of the detection light being reflected by the emission end face of the emitting waveguide and/or the end face of the cladding, and entering the corresponding second receiving waveguide.

4. The silicon photonic chip according to claim 3, wherein the first polarization rotator is connected to the output end of the first receiving waveguide, and each second polarization rotator is connected to the output end of the corresponding second receiving waveguide.

5. The silicon photonic chip according to claim 1, wherein the first photoelectric detection module comprises a first optical mixer and a first balanced photoelectric detector;
   the first optical mixer is configured to receive the first local oscillator light and the echo light, and to perform frequency mixing to output a first beat frequency light signal and a second beat frequency light signal; and
   the first balanced photoelectric detector is connected to the first optical mixer, and is configured to perform balanced detection on the first beat frequency light signal and the second beat frequency light signal.

6. A LIDAR, comprising:
   a housing;
   a light source module, configured to generate a source light signal;
   a silicon photonic chip, accommodated in the housing, wherein the silicon photonic chip is the silicon photonic chip according to claim 1, and is configured to transmit and emit the detection light for detecting a target object, wherein the detection light is a part of the source light signal, the silicon photonic chip is further configured to transmit the first local oscillator light and receive the echo light, and the first local oscillator light is a part of the source light signal.

7. The LiDAR according to claim 6, comprising a quarter wave plate,
   wherein the quarter wave plate is disposed on a side of the emitting waveguide for emitting the detection light and the receiving waveguide for receiving the echo light, and is configured to convert the detection light into an elliptical polarization state or a circular polarization state light signal.

8. A mobile device, comprising:
a movable substrate; and
a LiDAR, mounted on the substrate, wherein the LiDAR is the LiDAR according to claim 6.

\* \* \* \* \*